United States Patent
Yeh

(10) Patent No.: US 11,425,815 B2
(45) Date of Patent: Aug. 23, 2022

(54) LOAD ADAPTIVE DEVICE AND HAND-MADE CIRCUIT MODULE

(71) Applicant: AIDMICS BIOTECHNOLOGY (HK) CO., LIMITED, Wanchai (HK)

(72) Inventor: Chang-Ching Yeh, Wanchai (HK)

(73) Assignee: AIDMICS BIOTECHNOLOGY (HK) CO., LIMITED, Wanchai (HK)

( * ) Notice: Subject to any disclaimer, the term of this patent is extended or adjusted under 35 U.S.C. 154(b) by 0 days.

(21) Appl. No.: 17/169,186

(22) Filed: Feb. 5, 2021

(65) Prior Publication Data

US 2021/0251072 A1 Aug. 12, 2021

(30) Foreign Application Priority Data

Feb. 6, 2020 (TW) ................................. 109103724

(51) Int. Cl.
*H05K 1/02* (2006.01)
*H05K 1/11* (2006.01)
*H05K 1/18* (2006.01)

(52) U.S. Cl.
CPC ........... *H05K 1/0286* (2013.01); *H05K 1/111* (2013.01); *H05K 1/118* (2013.01); *H05K 1/189* (2013.01);
(Continued)

(58) Field of Classification Search
CPC ...... H05K 1/0286; H05K 1/111; H05K 1/118; H05K 1/189; H05K 1/14; H05K 1/0386;
(Continued)

(56) References Cited

U.S. PATENT DOCUMENTS 9,153,145 B2 * 10/2015 Valbuena ............. G09B 23/185
9,831,599 B2 * 11/2017 Bdeir ................. H01R 13/6205
(Continued)

FOREIGN PATENT DOCUMENTS

JP   2009122638 A * 6/2009
JP   2016166920 A * 9/2016
JP   2017187808 A * 10/2017

OTHER PUBLICATIONS

JP-2016166920-A (Translation) (Year: 2022).*
JP-2017187808-A (Translation) (Year: 2022).*
JP-2009122638-A (Translation) (Year: 2022).*

*Primary Examiner* — Timothy J Thompson
*Assistant Examiner* — John B Freal
(74) *Attorney, Agent, or Firm* — Muncy, Geissler, Olds & Lowe, P.C.

(57) ABSTRACT

A load adaptive device includes a substrate, a first electrode, a second electrode, and a passive element. The substrate is configured with a first conductor and a second conductor, and the surface area of the first conductor and/or the surface area of the second conductor are at least 15 $mm^2$. The distance between the center of the first conductor and the center of the second conductor is at least 9 mm. The first electrode, the second electrode and the passive element are disposed on the substrate. The first electrode is electrically connected to the first conductor. Two terminals of the passive element are electrically connected to the second conductor and the second electrode, respectively. In addition, a hand-made circuit module includes the load adaptive device and a hand-made loop. A part of the hand-made loop is consisted of a hand-bonded conductive tape.

20 Claims, 13 Drawing Sheets

(52) U.S. Cl.
CPC ............... *H05K 2201/094* (2013.01); *H05K 2201/09445* (2013.01); *H05K 2201/09909* (2013.01); *H05K 2201/1009* (2013.01); *H05K 2201/10022* (2013.01); *H05K 2201/10053* (2013.01); *H05K 2201/10083* (2013.01); *H05K 2201/10106* (2013.01); *H05K 2201/10121* (2013.01); *H05K 2201/10166* (2013.01)

(58) Field of Classification Search
CPC ... H05K 2201/094; H05K 2201/09445; H05K 2201/09909; H05K 2201/10022; H05K 2201/10053; H05K 2201/10083; H05K 2201/1009; H05K 2201/10106; H05K 2201/10121; H05K 2201/10166; H05K 3/321; H05K 3/0058
USPC ............................... 361/760, 767, 777, 782
See application file for complete search history.

(56) References Cited

U.S. PATENT DOCUMENTS

| | | | |
|---|---|---|---|
| 10,334,725 B1* | 6/2019 | Marasas, Jr. | H05K 1/0286 |
| 2008/0068816 A1* | 3/2008 | Han | H05K 1/0286 |
| | | | 439/39 |
| 2017/0092155 A1* | 3/2017 | Shim | G09B 23/183 |
| 2017/0227757 A1* | 8/2017 | Lin | G02B 27/286 |

* cited by examiner

LOAD ADAPTIVE DEVICE AND HAND-MADE CIRCUIT MODULE

CROSS REFERENCE TO RELATED APPLICATIONS

This Non-provisional application claims priority under 35 U.S.C. § 119(a) on Patent Application No(s). 109103724 filed in Taiwan, Republic of China on Feb. 6, 2020, the entire contents of which are hereby incorporated by reference.

BACKGROUND

Technology Field

The present disclosure relates to a load adaptive device and, in particular, to a load adaptive device and a hand-made circuit module including a load adaptive device.

Description of Related Art

The conventional hand-made circuit module used for teaching mainly contains a circuit board (a.k.a. breadboard), which is made of plastic material and configured with many holes on the surface. The pins of the electronic components can be plugged into the holes, and the copper wires can be provide to connect the components so as to form a circuit loop. In general, the copper wires and the electronic components are fixed by welding, winding, or clamping, thereby keeping the circuit loop on. However, the aforementioned fixing method is not only troublesome to operate and easy to loosen, but also may cause poor contact due to bad fixing operation. Therefore, the conventional hand-made circuit modules are easy to cause users' troubles in application, especially for people who have never contacted the circuit (e.g. non-professional or younger users). For example, the younger users may not finish the manufacturing of hand-made circuit module easily, and furthermore, the fingers of the younger users may be hurt by the copper wires or the pins of electronic components.

In addition, the electronic components have been fixed and cannot be arbitrarily replaced with other electronic components to enhance the fun of assembly. Furthermore, the circuit board and various accessories, including electronic components, copper wires and tools, occupy a certain space, are not easy to carry, and have high manufacturing cost.

Therefore, it is desired to provide a hand-made circuit module and a load adaptive device thereof that can allow the non-professional or younger users to finish the manufacturing easier, reduce the risk of hurting user's fingers, improve the convenience of using the hand-made circuit module, and decrease the occupied space and production cost thereof.

SUMMARY

In view of the foregoing, an objective of this disclosure is to provide a load adaptive device and a hand-made circuit module including a load adaptive device that can arbitrarily replace the electronic components of the load adaptive device. The users can simply conduct circuits of the load adaptive device and the hand-made circuit module by attaching the hand-bonded adhesive tape, thereby reducing the difficulty of manufacturing the circuit board and allowing the user to intuitively and easily operate. Accordingly, the load adaptive device and the hand-made circuit module including the load adaptive device of this disclosure have the advantages of simple circuit, easy to manufacture, low cost and convenient to carry, so that the application field thereof can be much wider.

To achieve the above, the present disclosure discloses a load adaptive device used for a hand-made circuit module and cooperated with a hand-bonded conductive tape. The load adaptive device comprises a substrate, a first electrode, a second electrode, and a passive element. The substrate is configured with a first conductor and a second conductor. The surface area of the first conductor and/or the surface area of the second conductor are at least 15 mm$^2$, and the distance between the center of the first conductor and the center of the second conductor is at least 9 mm. The first electrode and the second electrode are disposed on the substrate. The passive element is disposed on a first surface of the substrate. The first electrode is electrically connected to the first conductor, and two terminals of the passive element are electrically connected to the second conductor and the second electrode, respectively.

In one embodiment, the surface area of the first conductor and/or the surface area of the second conductor are greater than or equal to 15 mm$^2$, and are less than or equal to 100 mm$^2$.

In one embodiment, the first conductor and the second conductor are disposed on the first surface of the substrate.

In one embodiment, the first conductor and the second conductor are disposed on the first surface of the substrate and a second surface of the substrate opposite to the first surface, respectively.

In one embodiment, the load adaptive device further comprises a load unit, a positive electrode of the load unit is electrically connected to the first electrode, and a negative electrode of the load unit is electrically connected to the second electrode.

In one embodiment, the load unit comprises at least a load element, and the load elements are electrically connected in series or electrically connected in parallel.

In one embodiment, the load element comprises a light-emitting diode, a buzzer, a speaker, a motor, a fan, an electrochromic sheet, an electric heater, or an electromagnet.

In one embodiment, an insulating area is configured extending outwardly from outer peripheries of the first conductor and the second conductor, and a width from the outer periphery of the first conductor or the second conductor to an outer periphery of the insulating area is at least 1 mm.

In one embodiment, each of the first conductor and the second conductor is a circular, triangular, rectangular, or polygonal sheet structure.

In one embodiment, the substrate is a PC substrate or a flexible substrate.

In one embodiment, the flexible substrate comprises a paper substrate or a rubber substrate.

In one embodiment, the passive element is a resistor.

In one embodiment, the second surface of the substrate is coated with an adhesive layer, and a release film attaches to and covers the adhesive layer.

In one embodiment, the load adaptive device further comprises a switch element electrically connected to the load unit or the passive element in series.

In one embodiment, the switch element is a ball switch.

In one embodiment, the load adaptive device further comprises a plurality of marks disposed on the first surface of the substrate and located adjacent to the first conductor, the second conductor, the first electrode, and/or the second electrode.

In one embodiment, the load adaptive device further comprises a power source unit, the positive electrode of the power source unit is electrically connected to the first conductor, and the negative electrode of the power source unit is electrically connected to the second conductor.

In one embodiment, the load adaptive device further comprises a charge-discharge control unit, and the negative electrode of the power source unit is electrically connected to the second conductor through the charge-discharge control unit.

In one embodiment, the charge-discharge control unit comprises a transistor and a charge-discharge loop, the transistor comprises a third electrode, a fourth electrode and a control electrode, the third electrode is electrically connected to the second conductor, the charge-discharge loop is electrically connected to the control electrode and the fourth electrode, and the negative electrode of the power source unit is electrically connected to the charge-discharge loop and the fourth electrode.

To achieve the above, the present disclosure also discloses a hand-made circuit module, which comprises the above-mentioned load adaptive device and a hand-made loop. At least a part of the hand-made loop is consisted of a hand-bonded conductive tape. The hand-made loop electrically connects the first conductor of the load adaptive device to the positive electrode of the power source unit, and electrically connects the second conductor of the load adaptive device to the negative electrode of the power source unit.

To achieve the above, the present disclosure further discloses a hand-made circuit module, which comprises the above-mentioned load adaptive device and a hand-made loop. At least a part of the hand-made loop is consisted of a hand-bonded conductive tape. The hand-made loop electrically connects the first conductor of the load adaptive device to the positive electrode of the power source unit, and electrically connects the charge-discharge control unit of the load adaptive device to the negative electrode of the power source unit and the second conductor.

In one embodiment, another part of the hand-made loop is consisted of a conductive ink, a conductive adhesive, or a conductive paper.

As mentioned above, in the load adaptive device and the hand-made circuit module of this disclosure, the load element(s) of the load adaptive device can be arbitrarily replaced, and the users can simply conduct circuits of the load adaptive device and the hand-made circuit module by attaching the hand-bonded adhesive tape, thereby reducing the difficulty of manufacturing the circuit board and allowing the user to intuitively and easily operate. In addition, the users can manufacture the hand-made circuit module and arrange it in any shape or pattern. When the load adaptive device is installed with different load element(s), it can be controlled to output different functions such as sound, light or magnet. This disclosure can not only be applied to the teaching purpose, but also provide the fun in user's self-assembly and learning. As a result, the load adaptive device and the hand-made circuit module including the load adaptive device of this disclosure have the advantages of simple circuit, easy to manufacture, low cost and convenient to carry.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

In the load adaptive device and hand-made circuit module including a load adaptive device of this disclosure, the electronic components of the load adaptive device can be arbitrarily replaced. The users can simply conduct circuits of the load adaptive device and the hand-made circuit module by attaching the hand-bonded adhesive tape, thereby reducing the difficulty of manufacturing the circuit board and allowing the user to intuitively and easily operate. Accordingly, the load adaptive device and the hand-made circuit module including the load adaptive device of this disclosure have the advantages of simple circuit, easy to manufacture, low cost and convenient to carry.

Figure 1A:
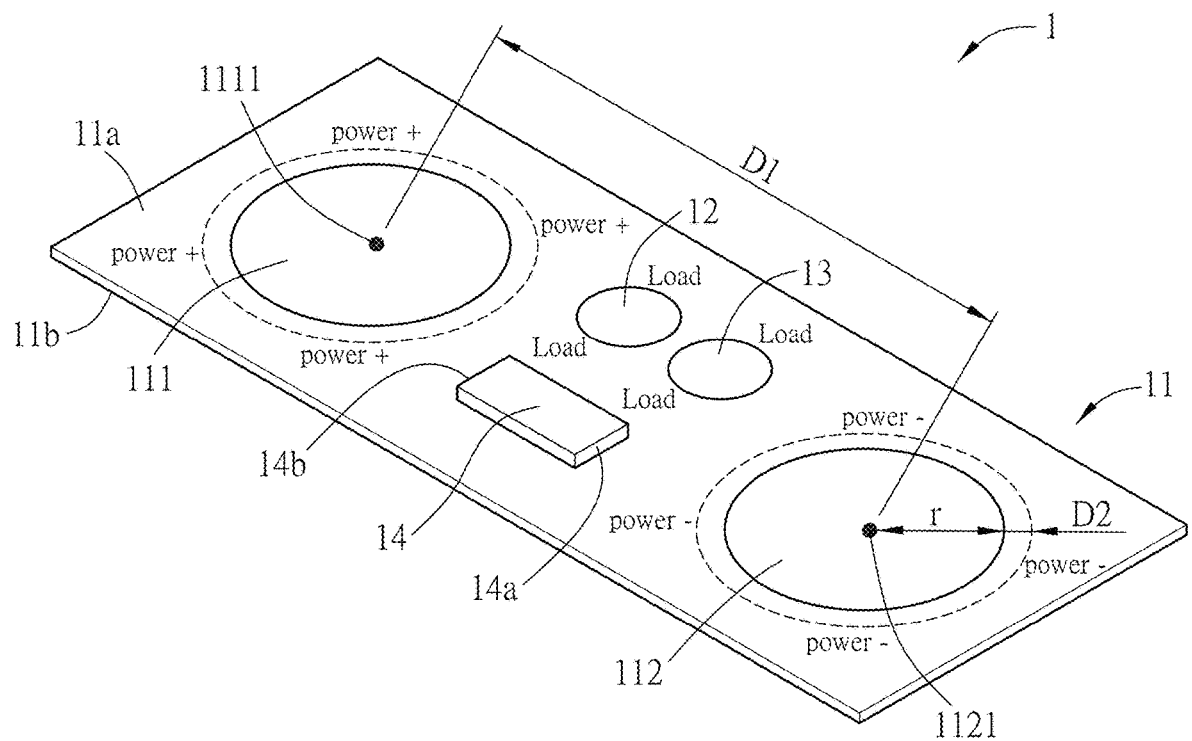
FIG. 1A is a schematic diagram showing a load adaptive device according to a first embodiment of this disclosure.
Figure 5A:
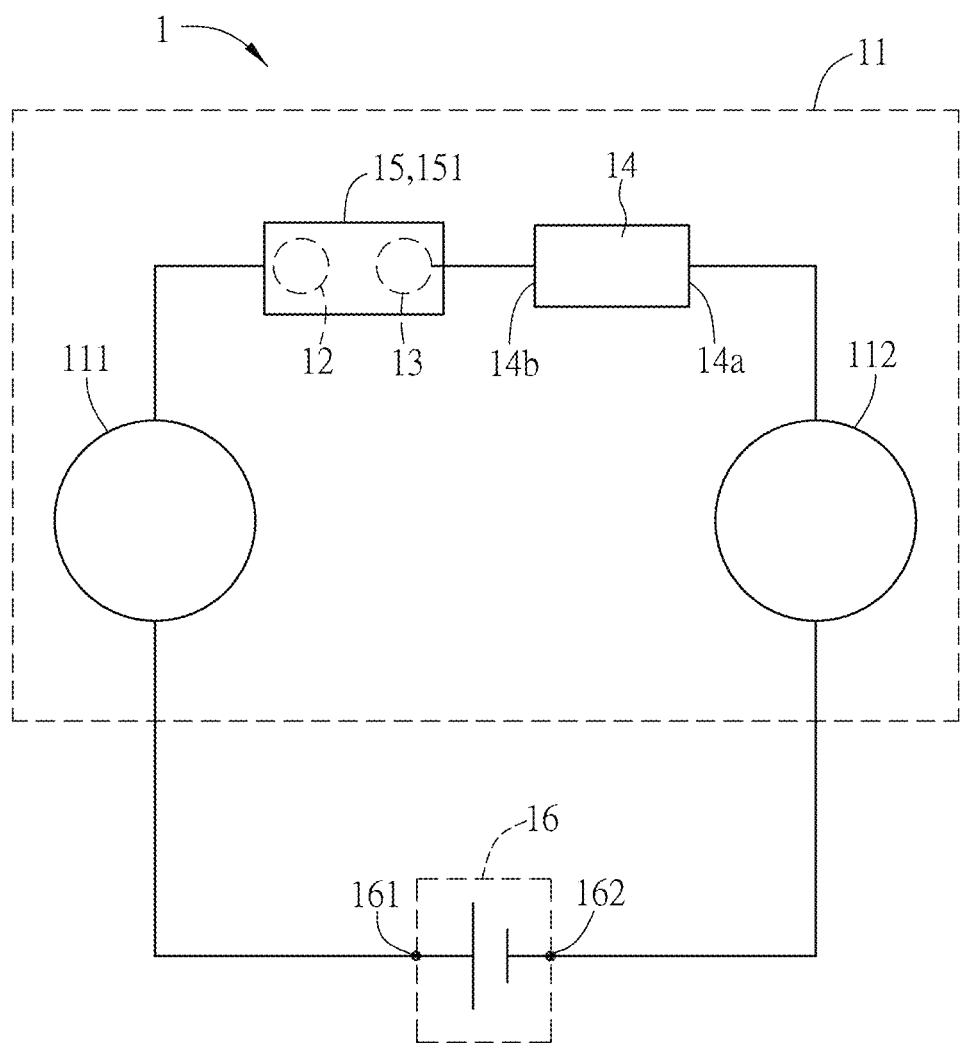
FIG. 5A is a schematic diagram showing the electronic connection between the load unit, the power source unit, and the load adaptive device of FIG. 1A.
Figure 6A:
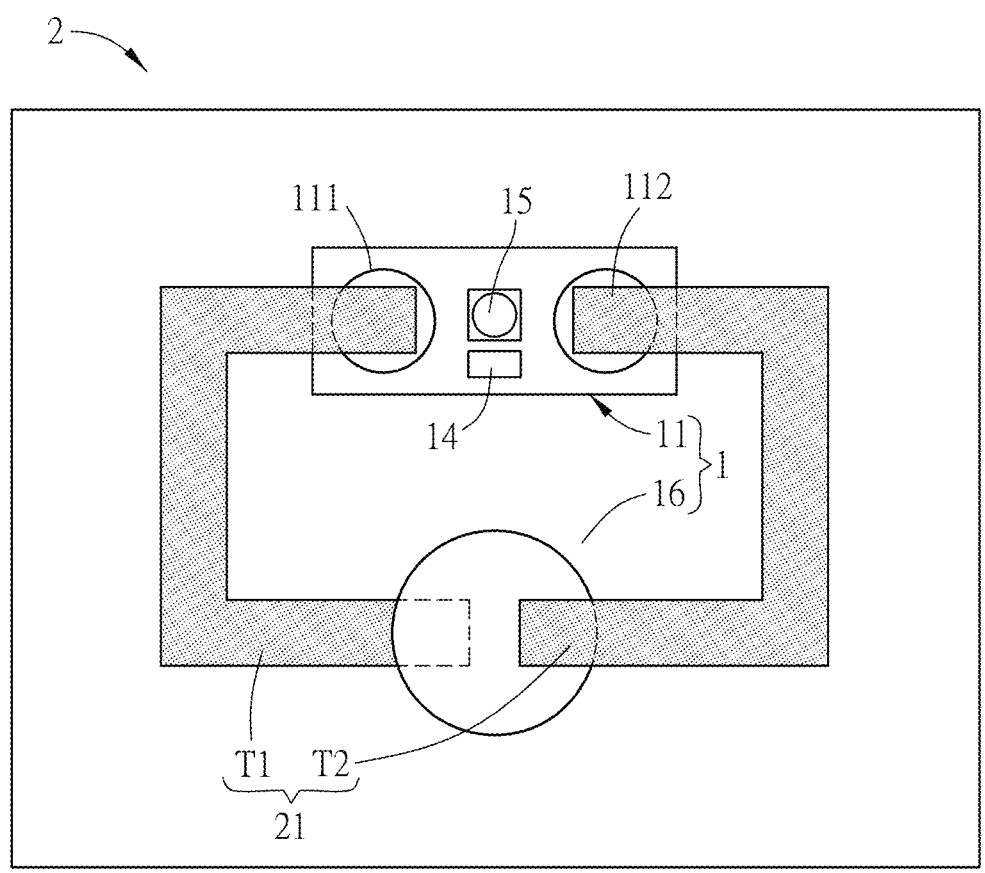
FIGS. 6A to 6C are schematic diagrams showing hand-made circuit modules according to different embodiments of the disclosure.

FIG. 1A is a schematic diagram showing a load adaptive device according to a first embodiment of this disclosure, FIG. 5A is a schematic diagram showing the electronic connection between the load unit, the power source unit, and the load adaptive device of FIG. 1A, and FIGS. 6A to 6C are schematic diagrams showing hand-made circuit modules according to different embodiments of the disclosure. As shown in FIG. 6A, this embodiment provides a load adaptive device 1 used for a hand-made circuit module 2 and cooperated with hand-bonded conductive tapes T1 and T2.

Referring to FIG. 1A, the load adaptive device 1 of this embodiment comprises a substrate 11, a first electrode 12, a second electrode 13, and a passive element 14. The substrate 11 is configured with a first conductor 111 and a second conductor 112. The surface area of the first conductor 111 and/or the surface area of the second conductor 112 are at least 15 mm$^2$, and the distance D1 between the center 1111 of the first conductor 111 and the center 1121 of the second conductor 112 is at least 9 mm. The first electrode 12 and the second electrode 13 are disposed on the substrate 11. The passive element 14 is disposed on a first surface 11a of the substrate 11. In one embodiment, as shown in FIGS. 1A and 5A, the first electrode 12 is electrically connected to the first conductor 111, one terminal 14a of the passive element 14 is electrically connected to the second conductor 112, and the other terminal 14b is electrically connected to the second electrode 13. To be noted, referring to FIG. 1A, the conductive wires, conductive bodies or conductive blocks for electrically connecting the first electrode 12 to the first conductor 111, the terminal 14a of the passive element 14 to the second conductor 112, and/or the terminal 14b of the passive element 14 to the second electrode 13 can be disposed inside the substrate 11 and are not shown in FIG. 1A. FIG. 5A is only for illustrating the electronic connections between the above-mentioned components, and is not to limit the relative positions of the components. In addition, in the case cooperating with the hand-bonded conductive tapes T1 and T2, since the surface area of the first conductor 111 and/or the surface area of the second conductor 112 are at least 15 mm$^2$, the user can easily attach the hand-bonded conductive tapes T1 and T2 to the surfaces of the first conductor 111 and/or the second conductor 112. Accordingly, since the contact area thereof is larger, the conductivity therebetween can be improved. As shown in FIG. 6A, the dotted lines show the parts of the first conductor 111 and/or the second conductor 112, which are covered by the hand-bonded conductive tapes T1 and T2. Moreover, since the distance D1 between the center 1111 of the first conductor 111 and the center 1121 of the second conductor 112 is equal to or greater than 9 mm, the short circuit, which is caused by attaching the hand-bonded conductive tape T1 or T2 to contact both of the first conductor 111 and the second conductor 112, can be prevented.

In this embodiment, the surface area of the first conductor 111 and/or the surface area of the second conductor 112 are greater than or equal to 15 mm$^2$, and are less than or equal to 100 mm$^2$. According to this design, the user can easily attach the hand-bonded conductive tapes T1 and T2 to the surfaces of the first conductor 111 and/or the second conductor 112. Since the contact area thereof is larger, the conductivity therebetween can be improved. In addition, this design can also prevent the too large surface areas of the first conductor 111 and/or the second conductor 112, which may occupy too much space in the load adaptive device 1.

As shown in FIG. 1A, in this embodiment, the first conductor 111 and the second conductor 112 are disposed on the first surface 11a of the substrate 11. In other words, the first conductor 111 and the second conductor 112 are disposed on the same surface (the first surface 11a) of the substrate 11.

Figure 1B:
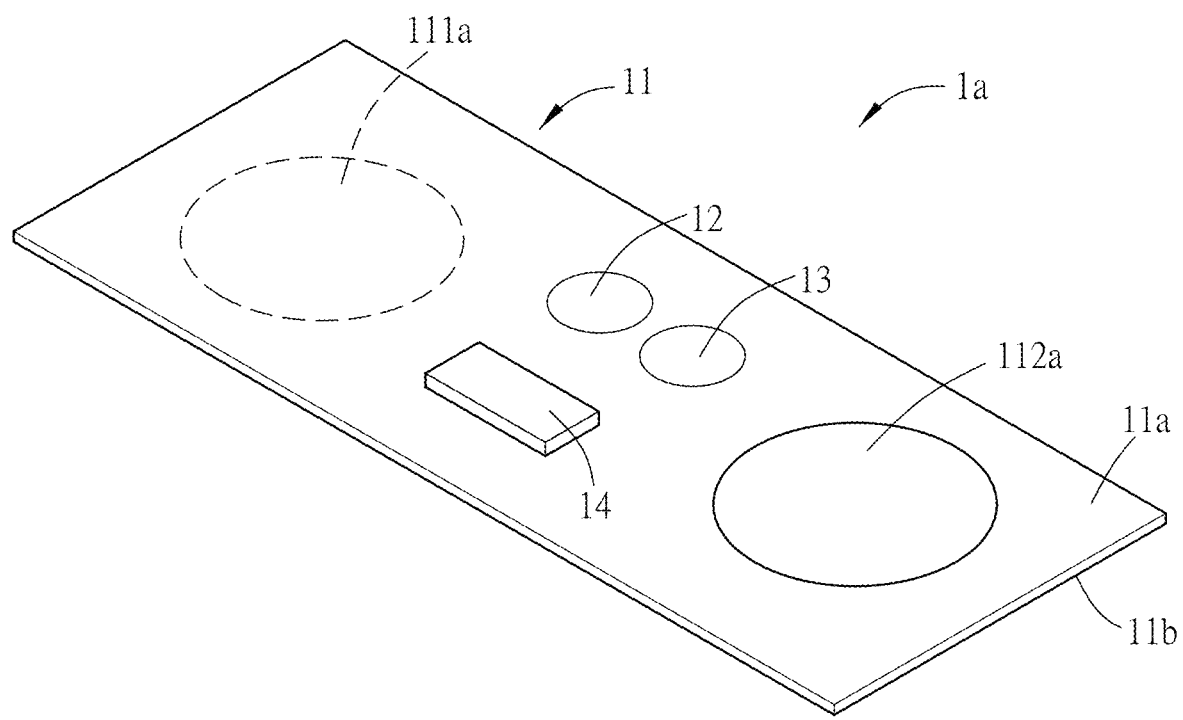
FIG. 1B is a schematic diagram showing a load adaptive device according to a second embodiment of this disclosure.

FIG. 1B is a schematic diagram showing a load adaptive device according to a second embodiment of this disclosure. As shown in FIG. 1B, in this embodiment, the first conductor 111a and the second conductor 112a of the load adaptive device 1a are disposed on the first surface 11a and the second surface 11b of the substrate 11, wherein the second surface 11b is opposite to the first surface 11a. To be noted, the structure, components and function of the load adaptive device 1a of the second embodiment are mostly the same as those of the load adaptive device 1 of the first embodiment. The difference between the first and second embodiments is in the configuration position of the first conductor 111a or the second conductor 112a. In FIG. 1B, since the first conductor 111a is disposed on the second surface 11b of the substrate, it cannot be directly observed in FIG. 1B and is shown by dotted lines.

Figure 2A:
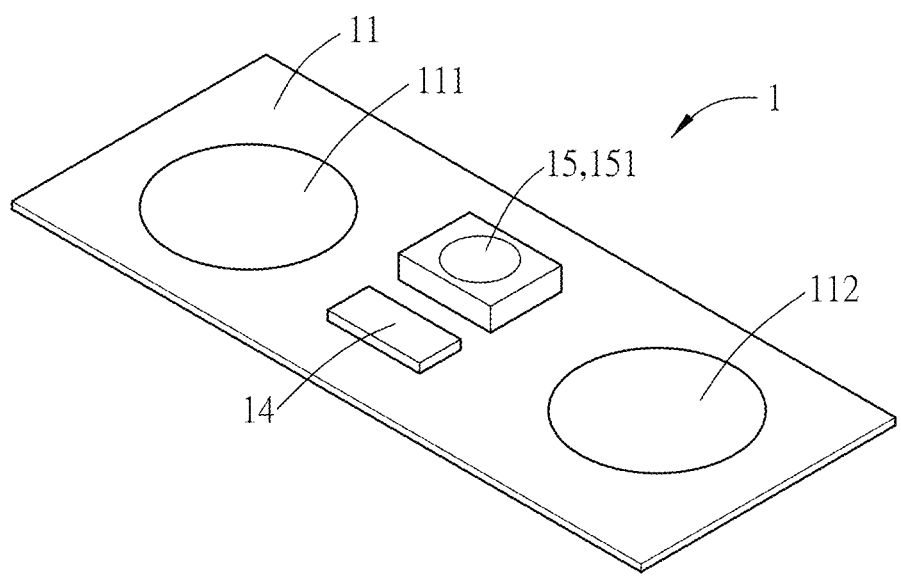
FIG. 2A is a schematic diagram showing the cooperation of the load unit and the load adaptive device of FIG. 1A.

FIG. 2A is a schematic diagram showing the cooperation of the load unit and the load adaptive device of FIG. 1A. Referring to FIGS. 1A and 2A, in this embodiment, the load adaptive device 1 can further comprise a load unit 15. The positive electrode of the load unit 15 is electrically connected to the first electrode 12, and the negative electrode of the load unit 15 is electrically connected to the second electrode 13. To be noted, referring to FIG. 2A, since the load unit 15 is disposed on the first electrode 12 and the second electrode 13, the first electrode 12 and the second electrode 13 are not shown in FIG. 2A. Moreover, in this embodiment, the load unit 15 can further comprise at least one load element 151, and the load elements 151 are electrically connected in series or electrically connected in parallel. Herein, the load unit 15 comprises one load element 151, and the load element 151 is, for example, an LED. To be noted, the load element 151 can be a buzzer, a speaker, a motor, a fan, an electrochromic sheet, an electric heater, or an electromagnet. Of course, the load unit 15 may comprise two or more load elements 151, and this disclosure is not limited.

In this embodiment, the passive element 14 is a resistor, and the passive element 14 and the load unit 15 are electrically connected in series.

Referring to FIG. 1A again, in this embodiment, an insulating area (shown as the dotted lines) is configured extending outwardly from outer peripheries of the first conductor 111 and the second conductor 112, and a width from the outer periphery of the first conductor or the second conductor to an outer periphery of the insulating area is at least 1 mm. Specifically, taking the second conductor 112 as an example, the second conductor 12 is a circular sheet structure, and the distance from the center 1121 to the periphery of the second conductor 112 is defined as the radius r of the second conductor 112. The insulating area (dotted lines) is located extending outwardly from the outer periphery of the second conductor 112, and the center of the insulating area is overlapped with the center 1121 of the second conductor 112. The outer radius of the insulating area is equal to the sum of the radius r of the second conductor 112 and the width D2 of the insulating area (the distance from the outer periphery of the insulating area to the outer periphery of the second conductor 112). Wherein, the width D2 is at least 1 mm. In other words, the outer periphery of the insulating area can be defined as the range extending outwardly from the outer periphery of the first conductor 111 and the second conductor 112 for at least 1 mm. Accordingly, the short circuit, which is caused by attaching the hand-bonded conductive tape to contact the other elements of the load adaptive device 1 (e.g. the first electrode 12, the second electrode 13, or the passive element 14), can be prevented.

Figure 3A:
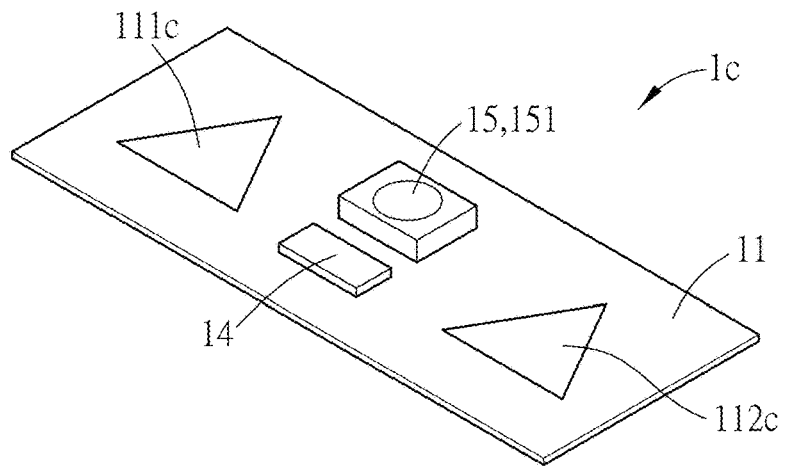
FIGS. 3A to 3C are schematic diagrams showing different aspects of the first conductor and the second conductor in the load adaptive device of this disclosure.
Figure 3B:
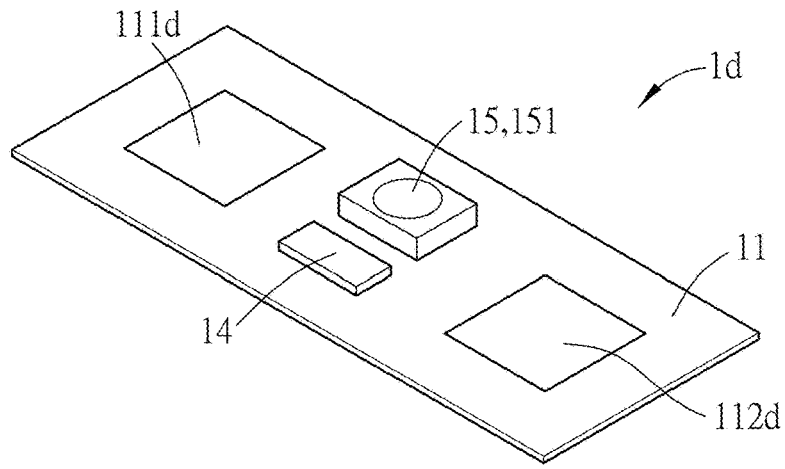
Figure 3C:
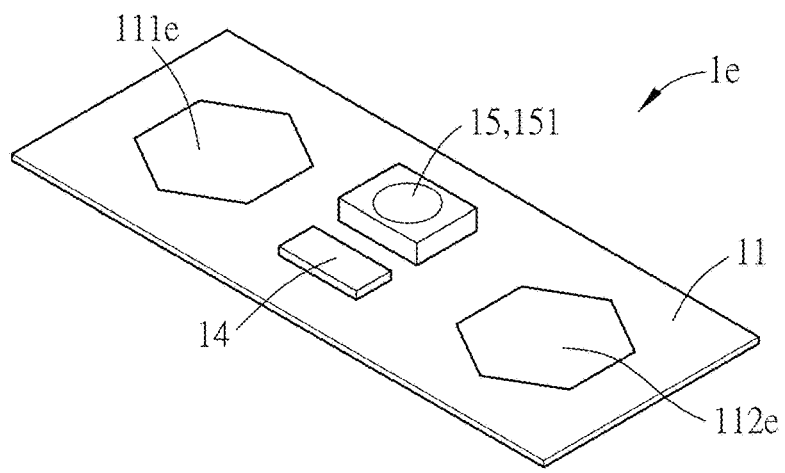

FIGS. 3A to 3C are schematic diagrams showing different aspects of the first conductor and the second conductor in the load adaptive device of this disclosure. Referring to FIG. 1A in view of FIGS. 3A to 3C, each of the first conductor and the second conductor can be a circular sheet structure, a triangular sheet structure, a rectangular sheet structure, or a polygonal sheet structure. As shown in FIG. 1A, the first conductor 111 and the second conductor 112 of the load adaptive device 1 are circular sheet structures. As shown in FIG. 3A, the first conductor 111c and the second conductor 112c of the load adaptive device 1c are triangular sheet structures. As shown in FIG. 3B, the first conductor 111d and the second conductor 112d of the load adaptive device 1d are rectangular sheet structures. To be noted, the shape of the rectangular sheet structure can be a square as shown in FIG. 3B, or any rectangle (quadrilateral) shape. As shown in FIG. 3C, the first conductor 111e and the second conductor 112e of the load adaptive device 1e are polygonal sheet structures. To be noted, the shape of the polygonal sheet structure can be a hexagon as shown in FIG. 3C, or any polygonal shape (e.g. pentagon, heptagon, octagon, etc.). This disclosure is not limited. In addition, the first conductor and the second conductor can be sheet structures in different shapes, which have the surface areas between 15 $mm^2$ and 100 $mm^2$, so that the user can easily attach the hand-bonded conductive tape. This disclosure is not limited thereto. The structures, components and functions of the load adaptive devices 1c, 1d and 1e are mostly the same as those of the load adaptive device 1 of the previous embodiment, and the differences therebetween are in the shapes of the first conductors 111c, 111d, 111e and the second conductors 112c, 112d, 112e.

In this embodiment, the substrate 11 is a PC substrate, such as, for example but not limited to, the aluminum substrate, iron substrate, paper phenol copper laminated substrate, paper epoxy copper laminated substrate, glass-epoxy copper laminated substrate, glass composite copper laminated substrate, glass-epoxy substrate or glass-phenyl resin substrate. Alternatively, the substrate 11 can be a flexible substrate such as, for example but not limited to, a paper substrate, a rubber substrate, a wood substrate, a bamboo substrate, a cotton substrate, a high-density fiber substrate, or any combination thereof. Preferably, the substrate 11 is a paper substrate or a rubber substrate.

Figure 4A:
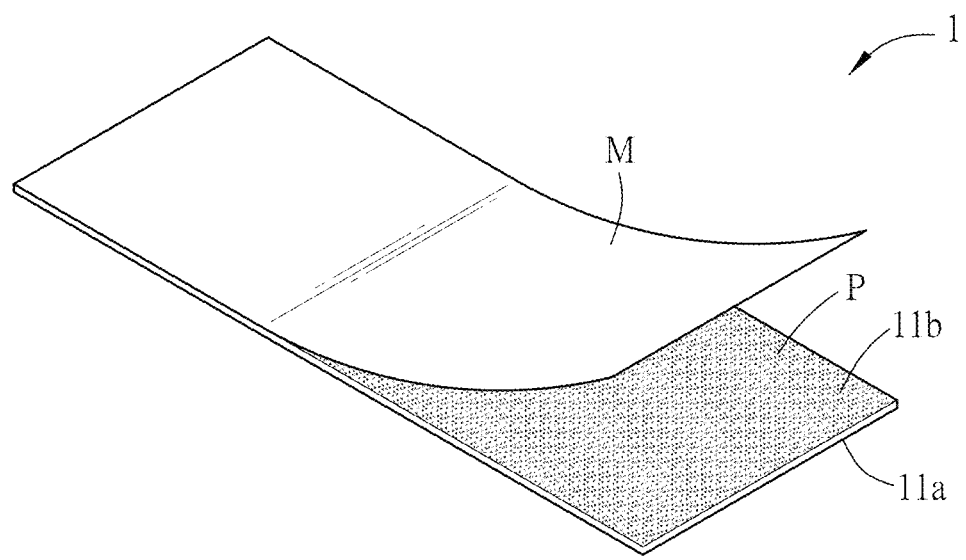
FIG. 4A is a schematic diagram showing the second surface of the substrate in the load adaptive device of FIG. 1A.
Figure 4B:
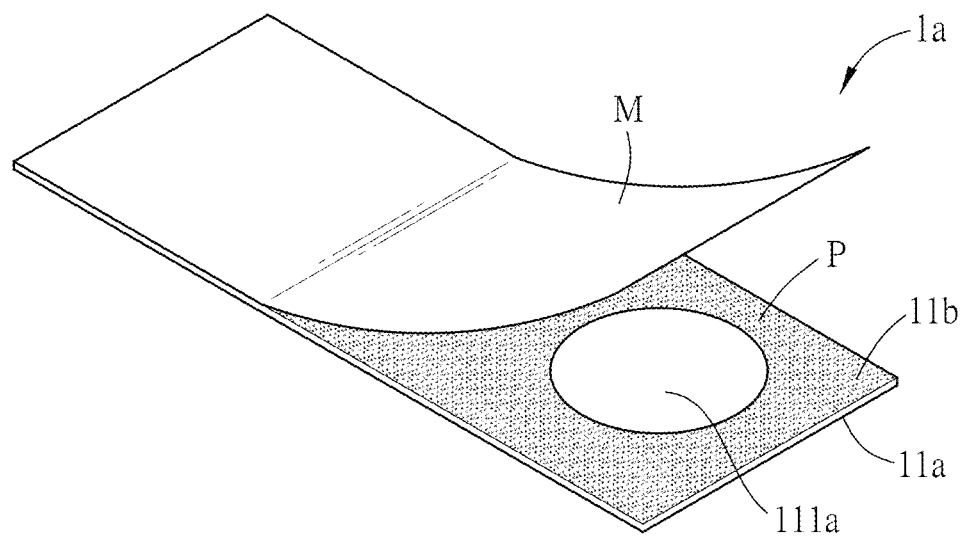
FIG. 4B is a schematic diagram showing the second surface of the substrate in the load adaptive device of FIG. 1B.

FIG. 4A is a schematic diagram showing the second surface of the substrate in the load adaptive device of FIG. 1A, and FIG. 4B is a schematic diagram showing the second surface of the substrate in the load adaptive device of FIG. 1B. As shown in FIGS. 1A, 1B, 4A and 4B, in this embodiment, the second surface 11b of the substrate 11 is coated with an adhesive layer P, and a release film M attaches to and covers the adhesive layer P. Referring to FIGS. 1A and 4A, the first electrode 12, the second electrode 13, the passive element 14, the first conductor 111 and the second conductor 112 are all disposed on the first surface 11a of the substrate 11, and the second surface 11b of the substrate 11 is coated with the adhesive layer P. The release film M is disposed on the adhesive layer P. In practice, the user can peel the release film M off the adhesive layer P, and then attach or stick the substrate 11 at any position through the adhesive layer P, thereby applying to the hand-made circuit module. Referring to FIGS. 1B and 4B, the first electrode 12, the second electrode 13, the passive element 14, and the second conductor 112a are all disposed on the first surface 11a of the substrate 11, and the first conductor 111a is disposed on the second surface 11b of the substrate 11. The second surface 11b of the substrate 11 is coated with the adhesive layer P, and the release film M is disposed on the adhesive layer P. In practice, the user can peel the release film M off the adhesive layer P, and then attach or stick the substrate 11 at any position through the adhesive layer P, thereby applying to the hand-made circuit module. Particularly, as shown in FIG. 4B, the adhesive layer P is disposed on a part of the second surface 11b other than the position of the first conductor 111a, thereby avoiding to reduce the conductivity of the first conductor 111a. To be noted, the application examples of the applying the load adaptive device 1 or 1a to the hand-made circuit module through the adhesive layer P will be described hereinafter. Moreover, FIGS. 4A and 4B show that the release film M is only partially bonded to the adhesive layer P, which indicates the procedure of peeling the release film M off the adhesive layer P. It should be understood that the release film M completely covers the adhesive layer P before the user peels the release film M off. When the user intends to attach the load adaptive device 1 or 1a to an object (e.g. the hand-made circuit module), he/she can start to peel the release film M off the adhesive layer P and then attach the load adaptive device 1 or 1a to the object through the adhesive layer P.

Figure 2B:
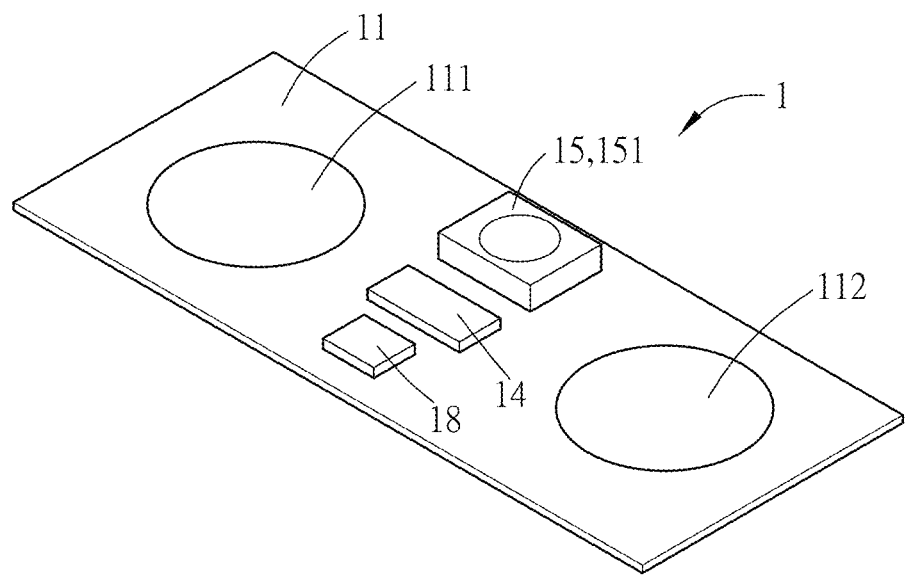
FIG. 2B is a schematic diagram showing the cooperation of the switch element and the load adaptive device of FIG. 2A.

FIG. 2B is a schematic diagram showing the cooperation of the switch element and the load adaptive device of FIG. 2A. As shown in FIG. 2B, the load adaptive device 1 of this embodiment further comprises a switch element 18, which is disposed on the substrate 11. The switch element 18 is electrically connected to the load unit 15 or the passive element 14 in series. To be noted, the conductive wires, conductive bodies or conductive blocks for electrically connecting the switch element 18 to the load unit 15, or the switch element 18 to the passive element 14 can be disposed inside the substrate 11 and are not shown in FIG. 2B. In this embodiment, the switch element 18 is a ball switch.

Referring to FIG. 5A, in this embodiment, the load adaptive device 1 can further comprise a power source unit 16. The positive electrode 161 of the power source unit 16 is electrically connected to the first conductor 111, and the negative electrode 162 of the power source unit 16 is electrically connected to the second conductor 112. For example, the load element 151 of the load unit 15 of the load adaptive device 1 is an LED. In this case, the load unit 15 of the load adaptive device 1 can be turned on (lighted up) after electrically connecting the power source unit 16 to the first conductor 111 and the second conductor 112. To be noted, as shown in FIG. 5A, since the load unit 15 is disposed on the first electrode 12 and the second electrode 13, the first electrode 12 and the second electrode 13 are blocked and are shown by dotted lines.

Figure 5B:
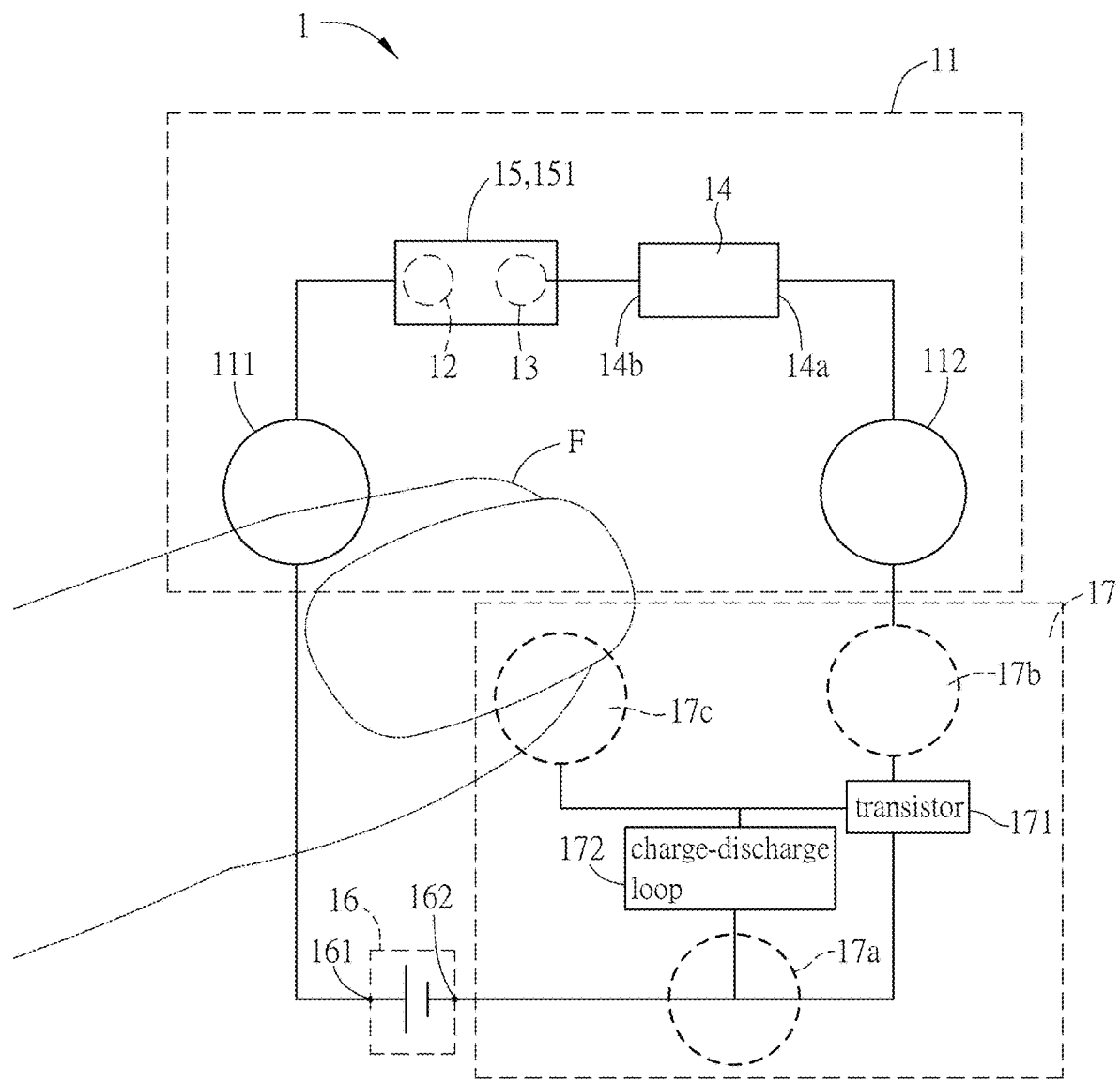
FIGS. 5B and 5C are schematic diagrams showing the electronic connections between the load unit, the power source unit, the charge-discharge control unit, and the load adaptive device of FIG. 1A.
Figure 5C:
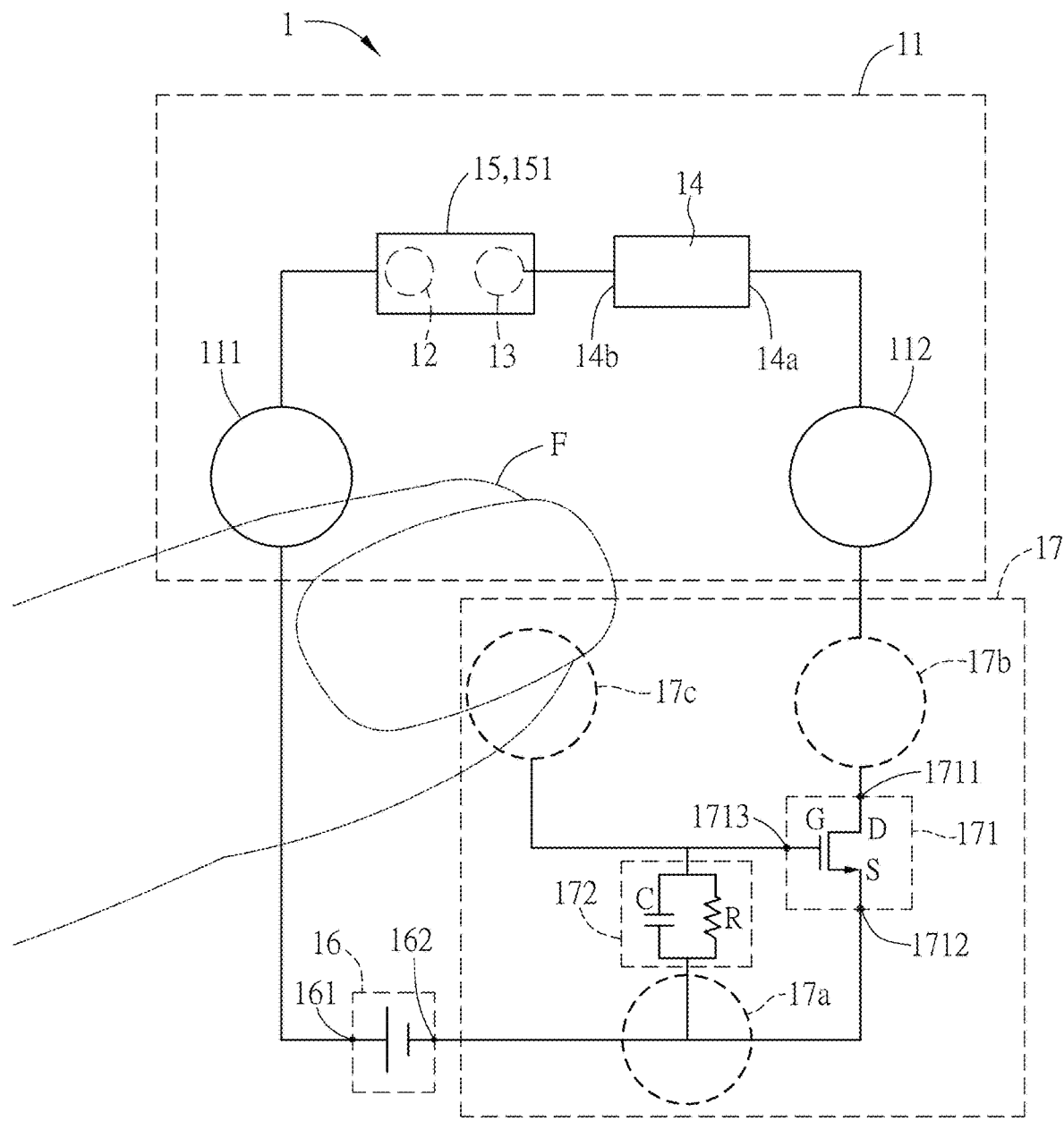

FIGS. 5B and 5C are schematic diagrams showing the electronic connections between the load unit, the power source unit, the charge-discharge control unit, and the load adaptive device of FIG. 1A. Referring to FIGS. 5B and 5C, the load adaptive device 1 of this embodiment further comprises a power source unit 16 and a charge-discharge control unit 17. The negative electrode 162 of the power source unit 16 is electrically connected to the second conductor 112 through the charge-discharge control unit 17, and the positive electrode 161 of the power source unit 16 is electrically connected to the first conductor 111.

In this embodiment, the charge-discharge control unit 17 comprises a transistor 171 and a charge-discharge loop 172. The transistor 171 comprises a third electrode 1711, a fourth electrode 1712, and a control electrode 1713. The third electrode 1711 is electrically connected to the second conductor 112, the charge-discharge loop 172 is electrically connected to the control electrode 1713 and the fourth electrode 1712, and the negative electrode 162 of the power source unit 16 is electrically connected to the charge-discharge loop 172 and the fourth electrode 1712. The transistor 171 can be a bipolar junction transistor (BJT), a field effect transistor (FET), or an insulated gate bipolar transistor (IGBT). The field effect transistor includes a junction field effect transistor (JFET) or a metal-oxide-semiconductor field-effect transistor (MOSFET). In this embodiment, the transistor 171 is, for example, an N-type MOSFET. Thus, the control electrode 1713 of the transistor 171 is the gate G of the MOSFET, the third electrode 1711 thereof is the drain D of the MOSFET, and the fourth electrode 1712 thereof is the source S of the MOSFET. In another embodiment, the control electrode 1713 of the transistor 171 is the gate G of the MOSFET, the third electrode 1711 thereof is the source S of the MOSFET, and the fourth electrode 1712 thereof is the drain D of the MOSFET. The skilled person in the art should understand the three electrodes of different types of transistors, so the detailed descriptions thereof will be omitted. Particularly, referring to FIGS. 5C and 6C, the charge-discharge control unit 17 can be configured with a third conductor 17a, a fourth conductor 17b, and a fifth conductor 17c, wherein the third electrode 1711 is electrically connected to the second conductor 112 through the fourth conductor 17b, the negative electrode 162 of the power source unit 16 is electrically connected to the charge-discharge loop 172 and the fourth electrode 1712 through the third conductor 17a, and the fifth conductor 17c is electrically connected to the charge-discharge loop 172 and the control electrode 1713. To be noted, the load adaptive device 1 can transform the first conductor 111 and the fifth conductor 17c into an active switch through the charge-discharge control unit 17. In practice, when the first conductor 111 and the fifth conductor 17c are conducted (e.g. by finger F), the load unit 15 (e.g. comprising LED (the load element 151)) can be turned on (lighted up). To be noted, since the load unit 15 is disposed on the first electrode 12 and the second electrode 13, the first electrode 12 and the second electrode 13 are blocked and are shown by dotted lines.

In this embodiment, the charge-discharge loop 172 includes a capacitor C and a resistor R, which are connected in parallel. The capacitor C is an electric storage element, and the RC parallel circuit has a time constant $\tau(\tau=R*C)$. This value $\tau$ determines the change rate of the electricity quantity of the capacitor C. The larger the time constant $\tau$, the slower the electricity change, and the longer the charging and discharging time. On the contrary, the smaller the time constant $\tau$, the faster the electricity change, and the shorter the charging and discharging time. In other words, the function of the charge-discharge loop 172 of this embodiment is similar to a timer, which controls the charging and/or discharging time by controlling the capacitance and/or resistance thereof, thereby controlling the operation and/or stop time of the load unit 15. For example, the charge-discharge loop 172 can control the On/Off time of the LED(s). In a different embodiment, the charge-discharge loop 172 can comprise a capacitor C only. The load unit 15 may comprise a plurality of load elements 151 (e.g. LED circuits or other electrovariable elements), which are connected in series and/or in parallel, depending on the circuit design requirement. In some embodiments, when the load unit 15 comprises a plurality of LEDs, which are connected in series, the multiple LEDs can be controlled to be turned on/off simultaneously. In other embodiments, when the load unit 15 comprises a plurality of LEDs, which are connected in parallel, the multiple LEDs can be controlled to be turned on/off sequentially.

Referring to FIG. 1A, the load adaptive device 1 can further comprise a plurality of marks, which are disposed on the first surface 11a of the substrate 11 and located adjacent to the first conductor 111, the second conductor 112, the first electrode 12, and/or the second electrode 13. In this embodiment, the marks can be, for example but not limited to, "power +", "power −", or "load". Wherein, "power +" represents the positive electrode of power source, "power −" represents the negative electrode of power source, and "load" represents the load (i.e. load unit). According to these marks, the user can realize that the first conductor 111 need to be electrically connected to the positive electrode 161 of the power source unit 16, and the second conductor 112 needs to be electrically connected to the negative electrode 162 of the power source unit 16, and the first electrode 12 and the second electrode 13 need to be electrically connected to the load unit 15. In practice, when the first conductor 111 and the second conductor 112 are electrically connected to other elements through the conductive tape, if one of the marks is blocked by the conductive tape, the user can still realize that the conductor (the first conductor 111 and/or the second conductor 112) needs to be electrically connected to which element(s) based on the other uncovered marks.

The application of the load adaptive device 1 in the hand-made circuit module 2 will be described hereinafter with reference to FIGS. 2A, 5A, 6A and 6B. In this embodiment, the hand-made circuit module 2 comprises a load adaptive device 1 (as mentioned above) and a hand-made loop 21. At least a part of the hand-made loop 21 is consisted of a hand-bonded conductive tape. In this embodiment, the hand-made loop 21 electrically connects the first conductor 111 of the load adaptive device 1 to the positive electrode 161 of the power source unit 16, and electrically connects the second conductor 112 of the load adaptive device 1 to the negative electrode 162 of the power source unit 16. As shown in FIG. 6A, the power source unit 16 is, for example, a battery. One hand-bonded conductive tape T1 electrically connects the positive electrode of the battery to the first conductor 111 of the load adaptive device 1, and another hand-bonded conductive tape T2 electrically connects the negative electrode of the battery to the second conductor 112 of the load adaptive device 1. Accordingly, the power source unit 16, the hand-made loop 21, and the components on the substrate 11 of the load adaptive device 1 can form a conducting loop, thereby enabling the load unit 15 disposed on the substrate 11 of the load adaptive device 1 to output light, heat or sound or to change color. To be noted, the embodiment of these figures utilizes the load adaptive device 1 as an example, but the other embodiments of the load adaptive devices 1a, 1c, 1d and 1e can also be used in the hand-made circuit module 2. This disclosure is not limited. As shown in FIG. 6A, a part of the substrate 11, a part of the first conductor 111, and a part of the second conductor 112, which are covered by the hand-bonded conductive tapes T1 and T2, are shown by dotted lines, a part of the power source unit 16, which is covered by the hand-bonded conductive tape T2, is shown by dotted lines, and a part of the hand-bonded conductive tape T1, which is covered by the power source unit 16, is shown by dotted lines.

Figure 6B:
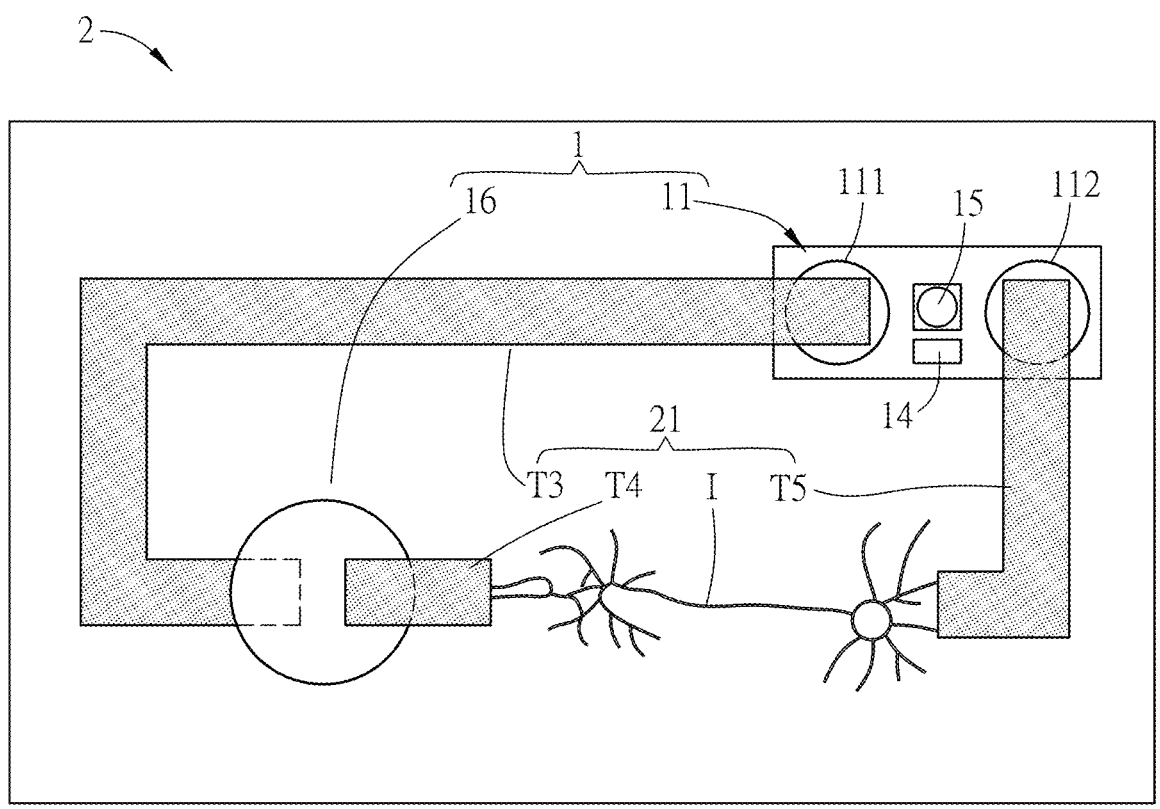

Referring to FIGS. 5A and 6B, in this embodiment, at least a part of the hand-made loop 21 is consisted of the hand-bonded conductive tapes T3, T4 and T5, and a part of the hand-made loop 21 is consisted of conductive ink I, conductive adhesive (not shown), or conductive paper (not shown). In this embodiment, the hand-made loop 21 electrically connects the first conductor 111 on the substrate 11 of the load adaptive device 1 to the positive electrode 161 of the power source unit 16, and electrically connects the second conductor 112 on the substrate 11 of the load adaptive device 1 to the negative electrode 162 of the power source unit 16. Specifically, the power source unit 16 is, for example, a battery. The hand-bonded conductive tape T3 electrically connects the positive electrode of the battery to the first conductor 111 on the substrate 11 of the load adaptive device 1, the hand-bonded conductive tape T4 electrically connects to the negative electrode of the battery, and the hand-bonded conductive tape T5 electrically connects to the second conductor 112 on the substrate 11 of the load adaptive device 1. The hand-bonded conductive tapes T4 and T5 are electrically connected to each other by the conductive ink I, so that the power source unit 16, the hand-made loop 21, and the components on the substrate 11 of the load adaptive device 1 can form a conducting loop, thereby enabling the load unit 15 disposed on the substrate 11 of the load adaptive device 1 to output light, heat or sound or to change color. To be noted, the conductive ink I is drawn as, for example, a neural pattern for connecting the hand-bonded conductive tapes T4 and T5. Of course, the hand-bonded conductive tapes T3, T4 and/or T5, the conductive ink I, the conductive adhesive, and/or the conductive paper can be arranged to form any of different patterns as long as the conducting pattern, the components on the substrate 11 of the load adaptive device 1, and the power source unit 16 can form a conducting loop, and this disclosure is not limited. In practice, the hand-made loop 21 can be formed into the desired pattern based on the configuration of the hand-bonded conductive tapes, the conductive ink, the conductive adhesive, and/or the conductive paper, thereby increasing the fun of user during assembling or manufacturing the hand-made circuit module 2. In addition, as shown in FIG. 6B, a part of the substrate 11, a part of the first conductor 111, and a part of the second conductor 112, which are covered by the hand-bonded conductive tapes T3 and T5, are shown by dotted lines, a part of the power source unit 16, which is covered by the hand-bonded conductive tape T4, is shown by dotted lines, and a part of the hand-bonded conductive tape T3, which is covered by the power source unit 16, is shown by dotted lines.

Figure 6C:
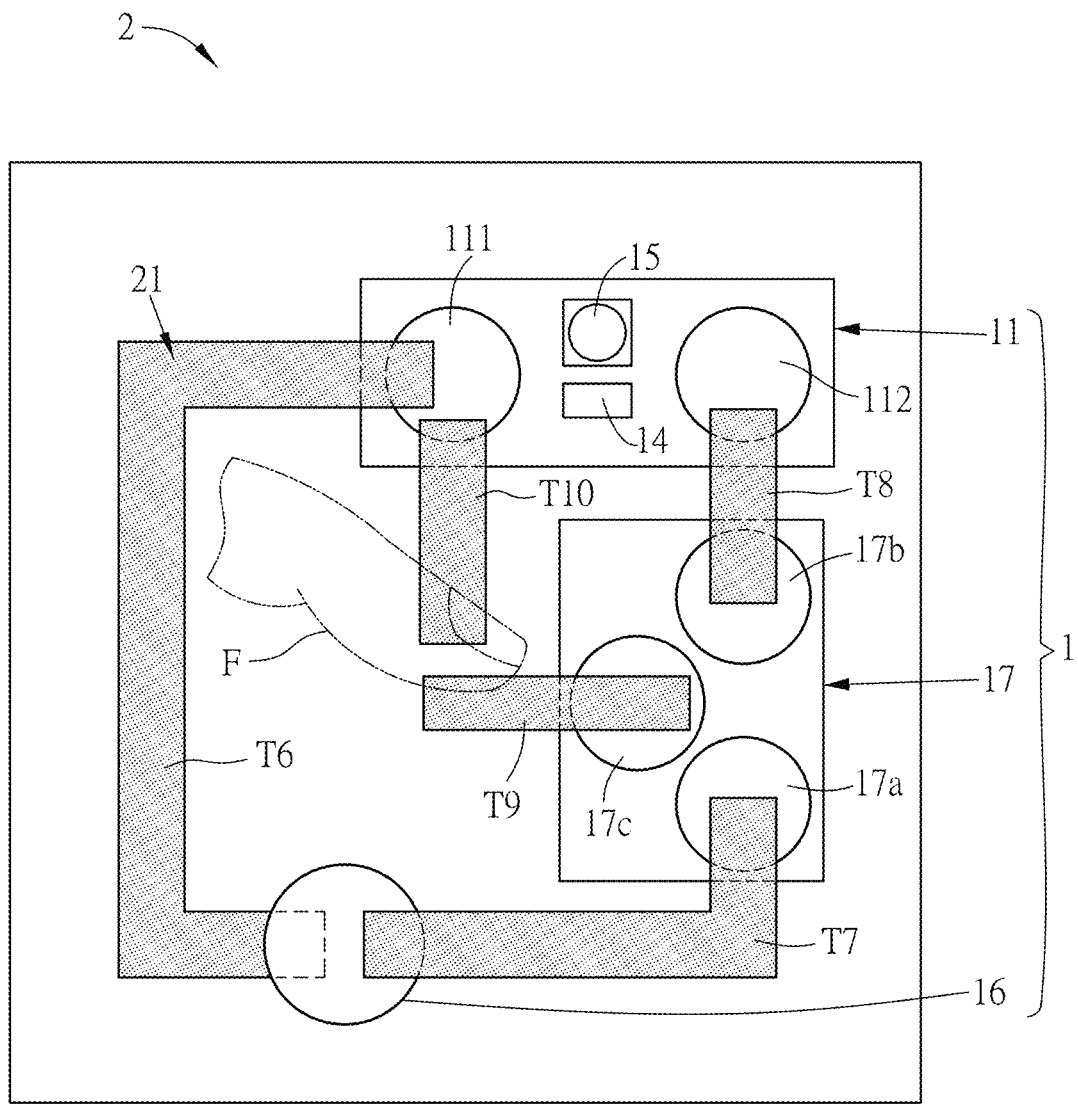

The application of the load adaptive device 1 in the hand-made circuit module 2 will be described hereinafter with reference to FIGS. 2A, 5C and 6C. In this embodiment, the hand-made circuit module 2 comprises a load adaptive device 1 (comprising the charge-discharge control unit 17) and a hand-made loop 21. At least a part of the hand-made loop 21 is consisted of a hand-bonded conductive tape. In this embodiment, the hand-made loop 21 electrically connects the first conductor 111 of the substrate 11 of the load adaptive device 1 to the positive electrode 161 of the power source unit 16, electrically connects the third conductor 17a of the charge-discharge control unit 17 of the load adaptive device 1 to the negative electrode 162 of the power source unit 16, and electrically connects the fourth conductor 17b of the charge-discharge control unit 17 of the load adaptive device 1 to the second conductor 112. As shown in FIG. 6C, the power source unit 16 is, for example, a battery. The hand-bonded conductive tape T6 electrically connects the positive electrode of the battery to a part of the first conductor 111 on the substrate 11 of the load adaptive device 1, the hand-bonded conductive tape T7 electrically connects the negative electrode of the battery to the third conductor 17a of the charge-discharge control unit 17, and the hand-bonded conductive tape T8 electrically connects to the second conductor 112 to the fourth conductor 17b of the charge-discharge control unit 17. In this case, the loop is not conducted yet. The first conductor 111 and the fifth conductor 17c are active switches, the first conductor 111 is electrically connected to the hand-bonded conductive tape T10, and the fifth conductor 17c is electrically connected to the hand-bonded conductive tape T9. When the first conductor 111 and the fifth conductor 17c are conducted (e.g. by using the finger F to contact the hand-bonded conductive tapes T9 and T10 simultaneously, or by directly using the finger F to contact the first conductor 111 and the fifth conductor 17c simultaneously without configuring the hand-bonded conductive tapes T9 and T10 (not shown)). Thus, the power source unit 16, the hand-made loop 21, and the components on the substrate 11 of the load adaptive device 1 can form a conducting loop, thereby enabling the load unit 15 of the load adaptive device 1 to output light, heat or sound or to change color. To be noted, as shown in FIG. 6C, a part of the substrate 11, a part of the first conductor 111, a part of the second conductor 112, a part of the third conductor 17a, a part of the fourth conductor 17b, a part of the fifth conductor 17c, and/or a part of the charge-discharge control unit 17, which are covered by the hand-bonded conductive tapes T6, T7, T8, T9 and/or T10, are shown by dotted lines, a part of the power source unit 16, which is covered by the hand-bonded conductive tape T7, is shown by dotted lines, and a part of the hand-bonded conductive tape T6, which is covered by the power source unit 16, is shown by dotted lines.

Figure 7A:
FIG. 7A is a schematic diagram showing a hand-made circuit module according to another embodiment of this disclosure.
Figure 7B:
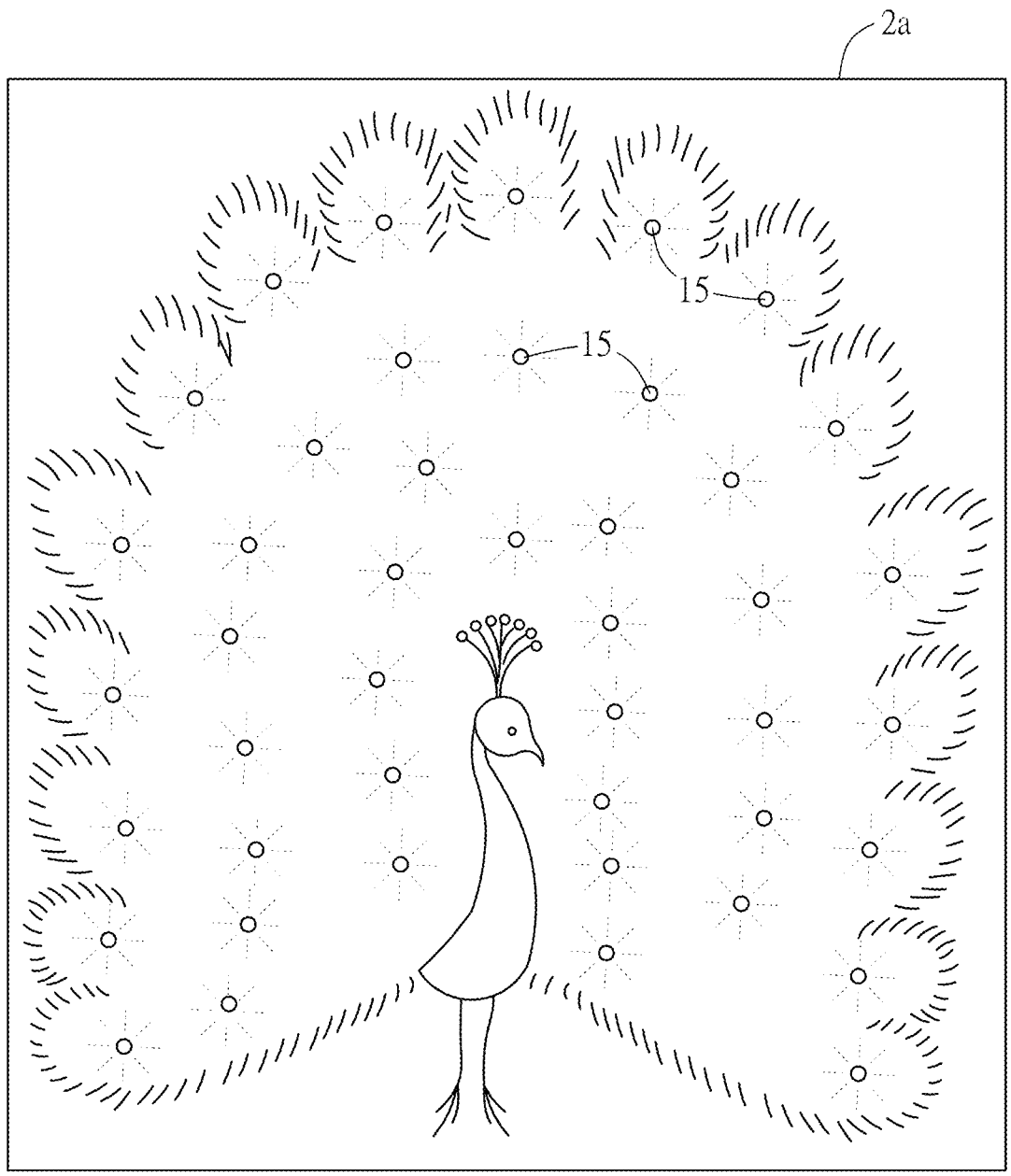
FIG. 7B is a schematic diagram showing the application of the hand-made circuit module of FIG. 7A.

FIG. 7A is a schematic diagram showing a hand-made circuit module according to another embodiment of this disclosure, and FIG. 7B is a schematic diagram showing the application of the hand-made circuit module of FIG. 7A. In this embodiment, the hand-made circuit module 2a comprises a plurality of the above-mentioned substrates 11 of the load adaptive device 1 (including the components disposed on the substrate 11), a power source unit 16, and hand-made loops 21. The hand-made circuit module 2a is formed with a peacock pattern, and the plural substrates 11 and the power source unit 16 can be attached to any positions on the peacock pattern. Any two of the substrates 11 or the substrate 11 and the power source unit 16 can be connected by the hand-made loop 21 to form a conducting loop. The hand-made loops 21 are shown in FIG. 7A as thick black lines, which can be hand-bonded conductive tapes, conductive inks, conductive adhesives, conductive papers, or the combinations thereof. Accordingly, the hand-made circuit module 2a can be lighted up as shown in FIG. 7B. In this embodiment, the substrate 11 can be configured with a switch element (e.g. a ball switch), and the switch element can be used to turn on/off the loop, thereby controlling the hand-made circuit module 2a to be lighted up or not. In this embodiment as shown in FIGS. 7A and 7B, for example, the substrates 11, the power source unit 16 and the hand-made loops 21 are electrically connected in series. To be noted, the substrates 11, some of the power source unit 16 and the hand-made loops 21 can be electrically connected in partial series and partial parallel, and this disclosure is not limited. Of course, the load adaptive devices 1a, 1c, 1d or 1e of the previous embodiments can also be applied to this embodiment, and only the electrical connections thereof must be considered. For example, regarding the load adaptive device 1 comprising the charge-discharge control unit 17, the power source unit 16 is electrically connected to the first conductor 111 and the third conductor 17a of the charge-discharge control unit 17, and the first conductor 111 and the fifth conductor 17c of the charge-discharge control unit 17 are functioned as active switches. In addition, the hand-made circuit module 2a of this embodiment is configured with the peacock pattern, but this disclosure is not limited thereto. In practice, the hand-made circuit module 2a can be configured with any of other patterns such as, for example but not limited to, insect, mammal, fish, building, plant, etc. In addition, although the load unit 15 of the load adaptive device 1 of this embodiment comprises LEDs, this disclosure is not limited thereto, and the load unit 15 may comprise a buzzer, a speaker, an electrochromic sheet, an electric heater, or an electromagnet. To be noted, the hand-made circuit module 2a can be made by any material, such as, for example but not limited to, paper, wood, rubber, cotton, bamboo, high-density fiber, glass, cement, etc. Alternatively, the substrates 11 of the load adaptive device 1, the power source unit 16, and the hand-made loops 21 can be directly attached to the surface of an object, such as, for example but not limited to, a wall, window, door, desktop, etc. Thus, the object can be used as a hand-made circuit module that carries the substrates 11 of the load adaptive device 1, the power source unit 16, and the hand-made loops 21. In other words, the hand-made circuit module 2a can also be a wall, window, door, desktop, etc., allowing users to enjoy the fun of assembling and manufacturing the hand-made circuit anytime and anywhere.

Based on the above-mentioned application examples and application situations, it is found that, in the load adaptive device and the hand-made circuit module of this disclosure, the load element(s) of the load adaptive device can be arbitrarily replaced, and the users can simply conduct circuits of the load adaptive device and the hand-made circuit module by attaching the hand-bonded adhesive tape, thereby reducing the difficulty of manufacturing the circuit board and allowing the user to intuitively and easily operate. Moreover, the load adaptive device and the hand-made circuit module including the load adaptive device of this disclosure have the advantages of simple circuit, easy to manufacture, low cost and convenient to carry. In addition, this disclosure can have different applications in cooperate with the operation environment, the type of load element(s), the material of hand-made loop, the pattern of hand-made loop, or the likes, thereby deriving various different operation modes and thus enhancing the fun in user's self-assembly and learning.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A load adaptive device used for a hand-made circuit module and cooperated with a hand-bonded conductive tape, the load adaptive device comprising:
   a substrate configured with a first conductor and a second conductor, wherein a surface area of the first conductor and/or a surface area of the second conductor are at least 15 mm$^2$, and a distance between a center of the first conductor and a center of the second conductor is at least 9 mm;
   a first electrode disposed on the substrate;
   a second electrode disposed on the substrate; and
   a passive element disposed on a first surface of the substrate, wherein the first electrode is electrically connected to the first conductor, and two terminals of the passive element are electrically connected to the second conductor and the second electrode, respectively.

2. The load adaptive device of claim 1, wherein the surface area of the first conductor and/or the surface area of the second conductor are greater than or equal to 15 mm$^2$, and are less than or equal to 100 mm$^2$.

3. The load adaptive device of claim 1, wherein the first conductor and the second conductor are disposed on the first surface of the substrate.

4. The load adaptive device of claim 1, wherein the first conductor and the second conductor are disposed on the first surface of the substrate and a second surface of the substrate opposite to the first surface, respectively.

5. The load adaptive device of claim 1, further comprising:
   a load unit, wherein a positive electrode of the load unit is electrically connected to the first electrode, and a negative electrode of the load unit is electrically connected to the second electrode.

6. The load adaptive device of claim 5, wherein the load unit comprises at least a load element, and the load elements are electrically connected in series or electrically connected in parallel.

7. The load adaptive device of claim 6, wherein the load element comprises a light-emitting diode, a buzzer, a speaker, a motor, a fan, an electrochromic sheet, an electric heater, or an electromagnet.

8. The load adaptive device of claim 1, wherein an insulating area is configured extending outwardly from outer peripheries of the first conductor and the second conductor, and a width from the outer periphery of the first conductor or the second conductor to an outer periphery of the insulating area is at least 1 mm.

9. The load adaptive device of claim 1, wherein each of the first conductor and the second conductor is a circular, triangular, rectangular, or polygonal sheet structure.

10. The load adaptive device of claim 1, wherein the substrate is a PC substrate or a flexible substrate, and the flexible substrate comprises a paper substrate or a rubber substrate.

11. The load adaptive device of claim 1, wherein the passive element is a resistor.

12. The load adaptive device of claim 3, wherein the second surface of the substrate is coated with an adhesive layer, and a release film attaches to and covers the adhesive layer.

13. The load adaptive device of claim 4, wherein the second surface of the substrate is coated with an adhesive layer, and a release film attaches to and covers the adhesive layer.

14. The load adaptive device of claim 5, further comprising:
   a switch element electrically connected to the load unit or the passive element in series, wherein the switch element is a ball switch.

15. The load adaptive device of claim 5, further comprising:
   a plurality of marks disposed on the first surface of the substrate and located adjacent to the first conductor, the second conductor, the first electrode, and/or the second electrode.

16. The load adaptive device of claim 1, further comprising:
   a power source unit, wherein a positive electrode of the power source unit is electrically connected to the first conductor, and a negative electrode of the power source unit is electrically connected to the second conductor.

17. The load adaptive device of claim 16, further comprising:
   a charge-discharge control unit, wherein the negative electrode of the power source unit is electrically connected to the second conductor through the charge-discharge control unit.

18. The load adaptive device of claim 17, wherein the charge-discharge control unit comprises a transistor and a charge-discharge loop, the transistor comprises a third electrode, a fourth electrode and a control electrode, the third electrode is electrically connected to the second conductor, the charge-discharge loop is electrically connected to the control electrode and the fourth electrode, and the negative electrode of the power source unit is electrically connected to the charge-discharge loop and the fourth electrode.

19. A hand-made circuit module, comprising:
a load adaptive device, comprising:
  a substrate configured with a first conductor and a second conductor, wherein a surface area of the first conductor and/or a surface area of the second conductor are at least 15 mm$^2$, and a distance between a center of the first conductor and a center of the second conductor is at least 9 mm,
  a first electrode disposed on the substrate,
  a second electrode disposed on the substrate,
  a passive element disposed on a surface of the substrate, wherein the first electrode is electrically connected to the first conductor, and two terminals of the passive element are electrically connected to the second conductor and the second electrode, respectively, and
  a power source unit, wherein a positive electrode of the power source unit is electrically connected to the first conductor, and a negative electrode of the power source unit is electrically connected to the second conductor; and
a hand-made loop, wherein at least a part of the hand-made loop is consisted of a hand-bonded conductive tape, wherein the hand-made loop electrically connects the first conductor of the load adaptive device to the positive electrode of the power source unit, and electrically connects the second conductor of the load adaptive device to the negative electrode of the power source unit, and another part of the hand-made loop is consisted of a conductive ink, a conductive adhesive, or a conductive paper.

20. A hand-made circuit module, comprising:
a load adaptive device, comprising:
  a substrate configured with a first conductor and a second conductor, wherein a surface area of the first conductor and/or a surface area of the second conductor are at least 15 mm$^2$, and a distance between a center of the first conductor and a center of the second conductor is at least 9 mm,
  a first electrode disposed on the substrate,
  a second electrode disposed on the substrate,
  a passive element disposed on a surface of the substrate, wherein the first electrode is electrically connected to the first conductor, and two terminals of the passive element are electrically connected to the second conductor and the second electrode, respectively,
  a power source unit, wherein a positive electrode of the power source unit is electrically connected to the first conductor, and a negative electrode of the power source unit is electrically connected to the second conductor, and
  a charge-discharge control unit, wherein the negative electrode of the power source unit and the second conductor are electrically connected through the charge-discharge control unit; and
a hand-made loop, wherein at least a part of the hand-made loop is consisted of a hand-bonded conductive tape, wherein the hand-made loop electrically connects the first conductor of the load adaptive device to the positive electrode of the power source unit, and electrically connects the charge-discharge control unit of the load adaptive device to the negative electrode of the power source unit and the second conductor, and another part of the hand-made loop is consisted of a conductive ink, a conductive adhesive, or a conductive paper.

* * * * *